(12) United States Patent
Cho et al.

(10) Patent No.: US 10,302,979 B2
(45) Date of Patent: May 28, 2019

(54) DISPLAY PANEL, METHOD OF MANUFACTURING DISPLAY PANEL, AND DISPLAY DEVICE

(71) Applicants: HKC Corporation Limited, Shenzhen (CN); Chongqing HKC Optoelectronics Technology Co., ltd., Chongqing (CN)

(72) Inventors: En-Tsung Cho, Chongqing (CN); Yiqun Tian, Chongqing (CN)

(73) Assignees: HKC CORPORATION LIMITED, Shenzhen (CN); CHONGQING HKC OPTOELECTRONICS TECHNOLOGY CO., LTD., Chongqing (CN)

( * ) Notice: Subject to any disclaimer, the term of this patent is extended or adjusted under 35 U.S.C. 154(b) by 0 days.

(21) Appl. No.: 15/869,286

(22) Filed: Jan. 12, 2018

(65) Prior Publication Data
US 2018/0329247 A1  Nov. 15, 2018

Related U.S. Application Data

(63) Continuation of application No. PCT/CN2017/096711, filed on Aug. 10, 2017.

(30) Foreign Application Priority Data

May 12, 2017  (CN) .......................... 2017 1 0334170

(51) Int. Cl.
| | | |
|---|---|---|
| *H01L 27/00* | (2006.01) | |
| *G02F 1/133* | (2006.01) | |
| *H01L 29/00* | (2006.01) | |
| *H01L 27/12* | (2006.01) | |
| *H01L 31/105* | (2006.01) | |

(Continued)

(52) U.S. Cl.
CPC ........ *G02F 1/13318* (2013.01); *G02F 1/1368* (2013.01); *H01L 27/124* (2013.01); *H01L 27/127* (2013.01); *H01L 27/1222* (2013.01); *H01L 27/1248* (2013.01); *H01L 27/1255* (2013.01); *H01L 29/78666* (2013.01); *H01L 31/1055* (2013.01); *G02F 2001/13312* (2013.01); *G02F 2001/136222* (2013.01); *G02F 2202/103* (2013.01)

(58) Field of Classification Search
CPC ............... H01L 27/1222; H01L 27/124; H01L 27/1248; H01L 27/1255; H01L 27/127; H01L 29/78666; H01L 29/78669; H01L 29/78693; H01L 31/1055; H01L 31/028; H01L 31/105; H01L 31/202; G02F 1/13318; G02F 1/1368; G02F 1/13452; G02F 2001/13312; G02F 2001/136222; G02F 2202/103
See application file for complete search history.

(56) References Cited

U.S. PATENT DOCUMENTS

| | | | |
|---|---|---|---|
| 6,682,960 B1 * | 1/2004 | Mochizuki | ............. H01L 27/12 257/E27.111 |
| 2008/0198140 A1 * | 8/2008 | Kinoshita | ............. G06F 3/0412 345/173 |
| 2011/0043734 A1 * | 2/2011 | Chang | .................. G02F 1/1339 349/106 |

* cited by examiner

*Primary Examiner* — Nikolay K Yushin
(74) *Attorney, Agent, or Firm* — WPAT, PC

(57) ABSTRACT

A display panel, a method of manufacturing a display panel, and a display device are provided. The display panel includes an array substrate and a color filter layer on the array substrate. The array substrate includes a display region and a non-display region. The display region includes a photo-sensor.

12 Claims, 2 Drawing Sheets

(51) Int. Cl.
*G02F 1/1368* (2006.01)
*H01L 29/786* (2006.01)
*G02F 1/1362* (2006.01)

DISPLAY PANEL, METHOD OF MANUFACTURING DISPLAY PANEL, AND DISPLAY DEVICE

BACKGROUND OF THE INVENTION

Field of the Invention

The invention relates to a display panel technology, and in particular to a display panel, a method of manufacturing a display panel, and a display device.

Description of the Related Art

With the development and progress of technology, liquid crystal display has advantages including a thin body, low power consumption, and low radiation. Accordingly, the liquid crystal display becomes the mainstream display products and has been widely used. Most of the liquid crystal displays on the market are backlit liquid crystal display, comprising a liquid crystal panel and a backlight module. The liquid crystal panel works by placing liquid crystal molecules between two parallel glass substrates and applying a driving voltage to the two glass substrates to control the direction of rotation of the liquid crystal molecules. As a result, the light from the backlight module is reflected to generate images.

Thin Film Transistor-Liquid Crystal Display (TFT-LCD) has gradually dominated the display field due to its low power consumption, excellent image quality and high production yield. Similarly, the TFT-LCD includes a liquid crystal panel and a backlight module. The liquid crystal panel includes a color filter substrate (CF Substrate), a thin-film transistor substrate (TFT Substrate), and a mask. There are transparent electrodes on the inner side of the CF Substrate and the TFT Substrate. A layer of liquid crystal molecules (LC) is sandwiched between the two substrates.

With the gradual development of LCD products, people are thinking and making improvements on how to make LCD with more excellent performance, for example, making LCD products be adjustable automatically according to changes in the external environment.

It should be noted that the above description of the technical background is merely intended to facilitate a clear and complete description of the technical solution of the present application and to facilitate the understanding of those skilled in the art. The foregoing technical solutions are not to be construed as well known to those skilled in the art simply because these technical solutions are described in the Background of the invention.

BRIEF SUMMARY OF THE INVENTION

In view of the above-mentioned drawbacks of the prior art, the technical problem to be solved in the application is to provide a display panel, a method of manufacturing a display panel, and a display device. The display panel is able to intelligently adjust the display contrast according to the brightness of the external environment.

In order to achieve the above-mentioned purpose, the application provides a display panel, comprising an array substrate and a color filter layer on the array substrate. The array substrate comprises a display region and a non-display region. A photo-sensor is disposed corresponding to the display region.

The application also discloses a method of manufacturing a display panel, comprising the steps of:

forming a gate over a glass substrate by etching;

forming a low-concentration doped P-type amorphous silicon layer on the gate;

sequentially forming a gate high-concentration doped N-type amorphous silicon layer, a gate amorphous silicon layer, and source and drain over the low-concentration doped P-type amorphous silicon layer on the gate to form a thin-film transistor;

forming a data line layer on an extending portion of the low-concentration doped P-type amorphous silicon layer with respect to the gate; and sequentially forming a light-sensitive high-concentration doped P-type amorphous silicon layer, a light-sensitive amorphous silicon layer and a light-sensitive high-concentration doped N-type amorphous silicon layer over the data line layer to form a photo-sensor.

In the application, a color photoresist is coated on a finished array substrate (ARRAY) to form a color filter layer. As a result, it is possible to solve the problem that the aperture ratio of the conventional color filter is low. At the same time, a photo-sensor is disposed corresponding to the display region of the array substrate, so that the brightness of the external environment of the display region can be perceived through the photo-sensor. In particular, changes in the strength of external light can be perceived. As a result, when the light is strong, the display device can automatically adjust to improve the brightness and enhance the contrast so as to avoid the image from being too dark and not clear. When the light is weak, the display device can correspondingly lower the brightness and reduce the contrast so as to avoid the image from being too bright and dazzling, which would damage eyes. Accordingly, the display device is capable of better and more intelligent adjustment in the display contrast and the display performance.

The specific embodiments of the application have been disclosed in detail with reference to the following description and the accompanying drawings, which specify the manner in which the principles of the application may be employed. It should be understood that the embodiments of the application is not limited thereto in scope. Within the scope of the spirit and terms of the appended claims, embodiments of the application include various changes, modifications, and equivalents.

The features described and/or shown in one embodiment may be used in one or more other embodiments in the same or similar manner. The features may be combined with or replace other features in other embodiments.

It should be emphasized that the term "comprise/include" used herein refers to the presence of a feature, whole piece, step or component. It does not exclude the presence or addition of one or more other features, whole pieces, steps or components.

BRIEF DESCRIPTION OF THE DRAWINGS

The accompanying drawings are used to provide a further understanding of the embodiments of the application. The drawings constitute a part of the specification for illustrating embodiments of the application and, together with the description, explaining the principles of the application. It will be apparent that the drawings accompanying with the following description are merely examples of the application. For those skilled in the art, other drawings may be obtained based on these drawings without inventive effort. In the drawings.

DETAILED DESCRIPTION OF THE INVENTION

In order to make those skilled in the art better understand the technical solution of the application, the technical solution in the embodiments of the application will be clearly and completely described in connection with the drawings in the embodiments of the application. It is apparent that the described embodiments are merely parts of the embodiments of the application, rather than all embodiments. Based on the embodiments of the application, all other embodiments obtained by those skilled in the art without inventive efforts are within the scope of the application.

Figure 1:
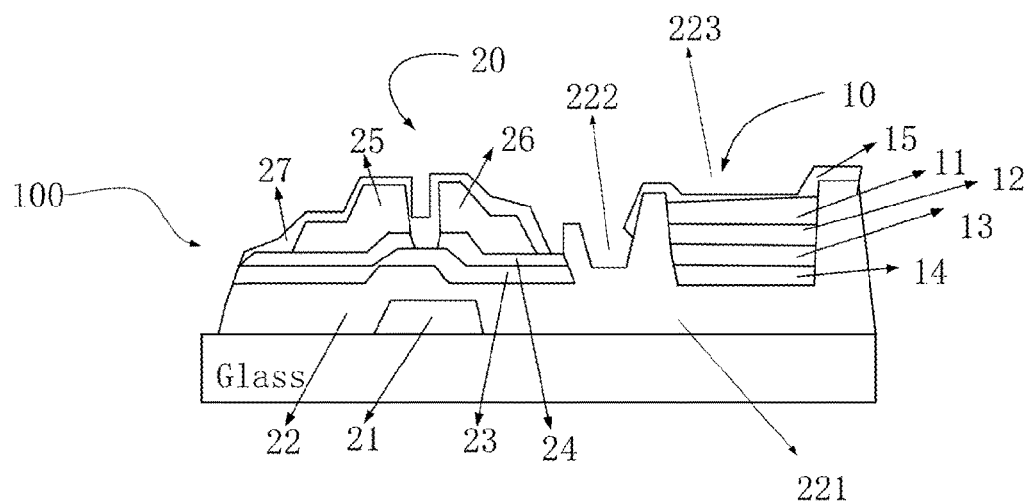
FIG. 1 is a schematic view showing an array substrate of a display panel of the application.
Figure 2:
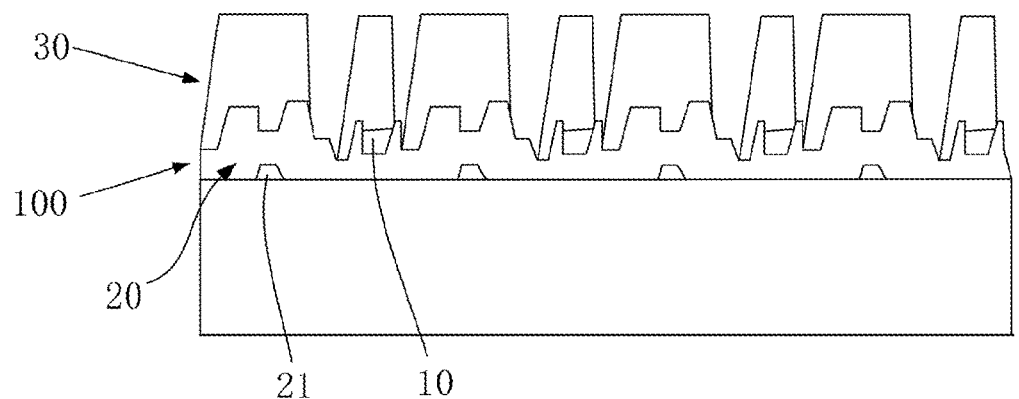
FIG. 2 is an overall schematic view showing a display panel of the application.

FIG. 1 is a schematic view showing an array substrate of a display panel of the application. FIG. 2 is an overall schematic view showing a display panel of the application. Referring to FIGS. 1 and 2, the application discloses a display panel comprising an array substrate 100 and a color filter layer 30 on the array substrate 100. The array substrate 100 comprises a display region and a non-display region. A photo-sensor 10 is disposed corresponding to the display region.

In the application, a color photoresist is coated on a finished array substrate (ARRAY) to form a color filter layer. As a result, it is possible to solve the problem that the aperture ratio of the conventional color filter is low. At the same time, a photo-sensor is disposed corresponding to the display region of the array substrate, so that the brightness of the external environment of the display region can be perceived through the photo-sensor. In particular, changes in the strength of external light can be perceived. As a result, when the light is strong, the display can automatically adjust to improve the brightness so as to avoid the image from being too dark and not clear. When the light is weak, the display can correspondingly lower the brightness so as to avoid the image from being too bright and dazzling, which would damage eyes. Accordingly, the display device is capable of better and more intelligent adjustment in the display contrast and the display performance.

In the embodiment, optionally, a thin-film transistor 20 is integrated in the display region. The photo-sensor 10 is disposed beside the thin-film transistor 20. In the scheme, the photo-sensor is disposed beside the thin-film transistor. It should be noted that thin-film transistors are spaced apart from each other. Disposing the photo-sensor between the thin-film transistors improves the space efficiency of the substrate.

In the embodiment, optionally, the thin-film transistor 20 includes, in order from the bottom to the top, a gate 21, a low-concentration doped P-type amorphous silicon layer 22 (P–α-Si), a high-concentration doped N-type amorphous silicon layer 23 (N+α-Si) and an amorphous silicon layer (α-Si) 24.

The low-concentration doped P-type amorphous silicon layer 22 extends outwardly and the photo-sensor 10 is disposed on the extending portion 221 of the low-concentration doped P-type amorphous silicon layer 22. In the scheme, the photo-sensor is disposed on the extending portion of the low-concentration doped P-type amorphous silicon layer. The extending portion is on the external of the low-concentration doped P-type amorphous silicon layer with respect to the thin-film transistor. The extending portion is spaced from the thin-film transistor by a distance. As a result, the thin-film transistor is prevented from being affected by electronic signals of the photo-sensor. The gate is made of copper or copper-molybdenum alloy.

In the embodiment, optionally, the extending portion 221 includes a first concave region 222 and a second concave region 223. The photo-sensor 10 is disposed in the second concave region 223. The extending portion includes two concave regions. The two concave regions isolate the thin-film transistor from the photo-sensor. It not only prevents the photo-sensor from being affected by the underneath light but also prevents the photo-sensor from being affected by the light coming from the thin-film transistor. It can be ensured that the light collected by the photo-sensor is from the external environment to avoid misjudgment and therefore improve the accuracy of self-regulation.

In the embodiment, optionally, the photo-sensor 10 includes, in order from the top to the bottom, a light-sensitive high-concentration doped N-type amorphous silicon layer 11, a light-sensitive amorphous silicon layer 12, and a light-sensitive high-concentration doped P-type amorphous silicon layer 13. In the scheme, the photo-sensor is actually a PIN photodiode. The PN junction of the photodiode is doped with an N-type semiconductor (i.e., the light-sensitive high-concentration doped N-type amorphous silicon described herein). Accordingly, when the sensed intensity of the light by the photo-sensor changes, the corresponding electronic signals will also change. The changes in electronic signals can be collected and analyzed, so that the display device is able to perceive the brightness of the light in the external environment. The display contrast can be adjusted accordingly. Therefore, the display performance is enhanced and the viewing experience is improved.

In the embodiment, optionally, the extending portion of the low-concentration doped P-type amorphous silicon layer 22 is provided with a data line layer 14 thereon. The photo-sensor 10 is disposed on the data line layer 14.

The photo-sensor 10 is covered with a conductive glass layer 15 thereon. In the scheme, the photo-sensor uses the data line layer as the lower electrode and the conductive glass layer as the upper electrode. The data line layer is utilized to be multi-function and common. As a result, when the sensed intensity of the external light by the photo-sensor changes, the display device is capable of self-adjustment accordingly. Therefore, the display contrast becomes more adaptable to the external environment, and the display performance is enhanced.

In the embodiment, optionally, a source 25 and a drain 26 opposite to the source 25 are disposed on the amorphous silicon layer (α-Si) 24. The external of the thin-film transistor 20 is covered by a passivation layer 27. In the scheme, the passivation layer 27 is provided on the external of the thin-film transistor 20 so as to separate the thin-film transistor 20 from other portions in the array substrate 100. The source 25, the drain 26, and portions of the amorphous silicon layer (α-Si) 24 are covered by the passivation layer 27. Accordingly, unnecessary problems induced by mutual influence are avoided.

In the embodiment, optionally, a color photoresist is disposed on the thin-film transistor 20 to form a color filter layer 30. In the scheme, the color photoresist is disposed on the thin-film transistor 20 using a COA technique. The color photoresist forms the color filter layer. Accordingly, it is able to solve the problem that the aperture ratio of the conventional color filter is low.

In the embodiment, optionally, the photo-sensor 10 corresponds to a display region and is disposed below the color filter layer. In the scheme, the photo-sensor is disposed corresponding to the display region but is disposed on one side of the color filter layer.

Figure 3:
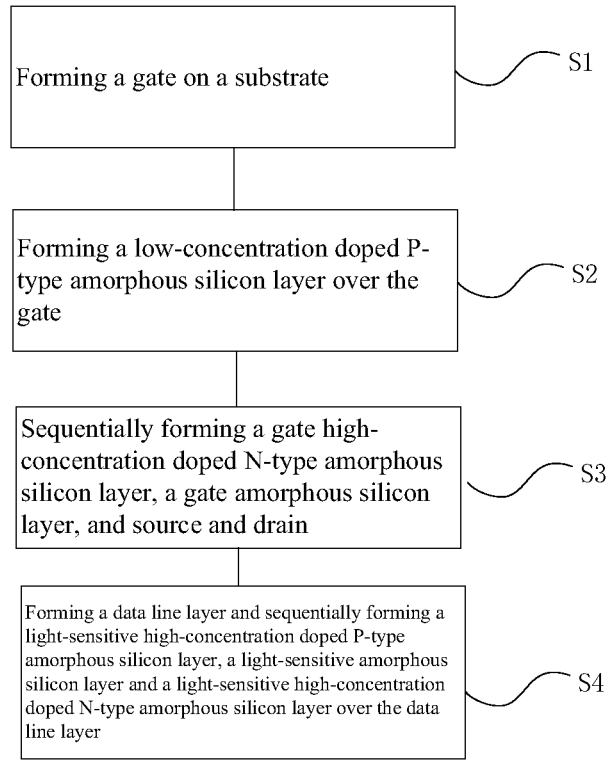
FIG. 3 is a flow chart of a fabrication method of the application.

FIG. 3 is a flow chart of a fabrication method of the application. Referring to FIG. 2 in combination of FIG. 1, the application also discloses a method of manufacturing a display panel, comprising the steps of:

S1: forming a gate on a substrate;

S2: forming a low-concentration doped P-type amorphous silicon layer on and cover the gate; wherein the low-concentration doped P-type amorphous silicon layer includes an extending portion, the extending portion includes a first concave region and a second concave region both spaced apart from the gate;

S3: sequentially forming a high-concentration doped N-type amorphous silicon layer, an amorphous silicon layer, and a source and a drain on the low-concentration doped P-type amorphous silicon layer corresponding to the gate to form a thin-film transistor;

S4: forming a data line layer in the second concave region; and sequentially forming a light-sensitive high-concentration doped P-type amorphous silicon layer, a light-sensitive amorphous silicon layer and a light-sensitive high-concentration doped N-type amorphous silicon layer on the data line layer to form a photo-sensor. The photo sensor is positioned in the second concave region, the first concave region is positioned between the thin-film transistor and the photo-sensor, thereby isolating the thin-film transistor from the photo-sensor. Next, a conductive glass layer is formed on the photo-sensor, the photo-sensor uses the data line layer as a lower electrode and uses the conductive glass layer as an upper electrode.

In the application, the color photoresist is coated on the finished array substrate (ARRAY) to form the color filter layer. As a result, it is possible to solve the problem that the aperture ratio of the conventional color filter is low. At the same time, a photo-sensor is disposed corresponding to the display region of the array substrate, so that the brightness of the external environment of the display region can be perceived through the photo-sensor. In particular, changes in the strength of external light can be perceived. As a result, when the light is strong, the display device can automatically adjust to improve the brightness so as to avoid the image from being too dark and not clear. When the light is weak, the display device can correspondingly lower the brightness so as to avoid the image from being too bright and dazzling, which would damage eyes. Accordingly, the display device is capable of better and more intelligent adjustment in the display contrast and the display performance.

Figure 4:
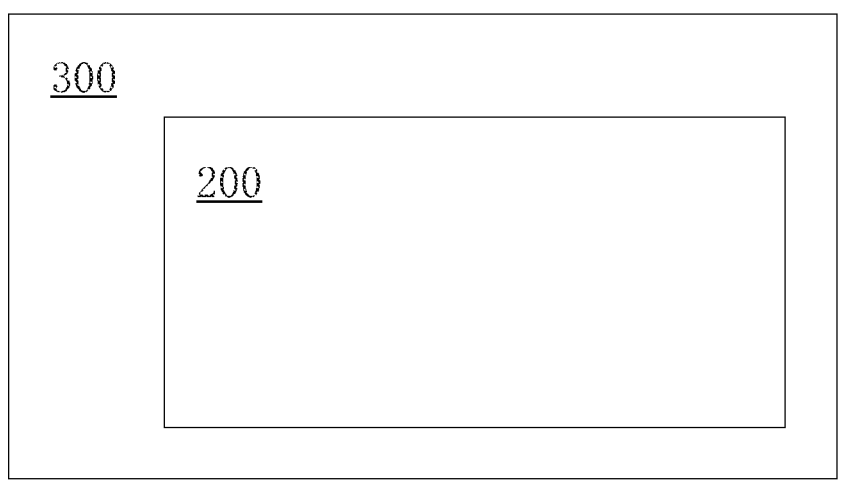
FIG. 4 is a schematic view showing a display device of the application.

FIG. 4 is a schematic view showing a display device of the application. Referring to FIG. 3 in combination of FIGS. 1 and 2, the application also discloses a display device 300 comprising the display panel 200 as disclosed in any one of the embodiments.

The benefits of the application include that the display panel in the display device of the application is formed using a COA technique so as to solve the problem that the aperture ratio of the conventional color filter is low. The COA technique includes coating a color photoresist on a finished array substrate (TFT ARRAY) to form a color filter. At the same time, a photo-sensor is disposed corresponding to the display region of the array substrate, so that the brightness of the external environment of the display region can be perceived through the photo-sensor. In particular, changes in the strength of external light can be perceived. As a result, when the light is strong, the display device can automatically adjust to improve the brightness so as to avoid the image from being too dark and not clear. When the light is weak, the display device can correspondingly lower the brightness so as to avoid the image from being too bright and dazzling, which would damage eyes. Accordingly, the display device is capable of better and more intelligent adjustment in the display contrast and the display performance.

The application has been described in detail by the preferred specific embodiments. It is to be understood that various modifications and variations can be made by those skilled in the art according to the teachings of the application without inventive effort. Therefore, the scope of the appended claims should be accorded the broadest interpretation to encompass all embodiments that those skilled in the art would obtain through logical analysis, reasoning or limited experimentation according to the teachings of the application and based on the prior art.

What is claimed is:

1. A display panel, comprising:
an array substrate and a color filter layer on the array substrate,
wherein the array substrate comprises a display region and a non-display region, and the display region comprises a thin-film transistor integrated therein and a photo-sensor beside the thin-film transistor,
wherein the thin-film transistor comprises a gate, a low-concentration doped P-type amorphous silicon layer, a high-concentration doped N-type amorphous silicon layer and an amorphous silicon layer in that order from bottom to top, and the low-concentration doped P-type amorphous silicon layer extends outwardly thereby forming an extending portion,
wherein the extending portion comprises a first concave region and a second concave region, the photo-sensor is disposed in the second concave region thereby isolating the thin-film transistor from the photo-sensor, and the first concave region is positioned between the thin-film transistor and the photo-sensor,
wherein the photo-sensor comprises a light-sensitive high-concentration doped N-type amorphous silicon layer, a light-sensitive amorphous silicon layer and a light-sensitive high-concentration doped P-type amorphous silicon layer in that order from top to bottom,
wherein a data line layer is disposed in the second concave region, the photo-sensor is disposed on the data line layer and is covered with a conductive glass layer, and the photo-sensor uses the data line layer as a lower electrode and uses the conductive glass layer as an upper electrode,
wherein the thin-film transistor further comprises a source and a drain both formed on the amorphous silicon layer, and an external of the thin-film transistor is covered by a passivation layer,
wherein the thin-film transistor and the photo-sensor are below the color filter layer.

2. A display panel, comprising:
an array substrate and a color filter layer on the array substrate,
wherein the array substrate comprises a display region and a non-display region, and the display region comprises a photo-sensor and a plurality of thin-film transistors, the photo-sensor is disposed between the plurality of thin-film transistors;
wherein the plurality of thin-film transistors comprises a first thin-film transistor and an adjacent second thin-film transistor, the first thin-film transistor comprises a gate and a low-concentration doped P-type amorphous silicon layer formed on the gate, the low-concentration doped P-type amorphous silicon layer extends outwardly thereby forming an extending portion, the extending portion comprises a first concave region and a second concave region both spaced apart from the gate, the first concave region is positioned between the first thin-film transistor and the second concave region, the second concave region is positioned between the first concave region and the second thin-film transistor, and the photo-sensor is disposed in the second concave region thereby isolating the photo-sensor from the plurality of thin-film transistors.

3. The display panel as claimed in claim 2, wherein the photo-sensor comprises a light-sensitive high-concentration doped N-type amorphous silicon layer, a light-sensitive amorphous silicon layer and a light-sensitive high-concentration doped P-type amorphous silicon layer in order from top to bottom.

4. The display panel as claimed in claim 2,
wherein the photo-sensor and the plurality of thin-film transistors are disposed below the color filter layer.

5. The display panel as claimed in claim 2, wherein a data line layer is disposed in the second concave region, the photo-sensor is disposed on the data line layer-and is covered with a conductive glass layer, and the photo-sensor uses the data line layer as a lower electrode and uses the conductive glass layer as an upper electrode.

6. The display panel as claimed in claim 2, wherein the first thin-film transistor further comprises a source and an opposite drain both formed on the amorphous silicon layer, and an external of the first thin-film transistor is covered by a passivation layer.

7. The display panel as claimed in claim 6, wherein the source, the drain and portions of the amorphous silicon layer are covered by the passivation layer.

8. The display panel as claimed in claim 2, wherein the first thin-film transistor further comprises a high-concentration doped N-type amorphous silicon layer and an amorphous silicon layer sequentially formed on the low-concentration doped P-type amorphous silicon layer.

9. The display panel as claimed in claim 8, wherein a data line layer is disposed in the second concave region, the photo-sensor is disposed on the data line layer and is covered with a conductive glass layer, and the photo-sensor uses the data line layer as a lower electrode and uses the conductive glass layer as an upper electrode.

10. The display panel as claimed in claim 8, wherein the first thin-film transistor further comprises a source and a drain opposite to the source, the source and the drain both are formed on the amorphous silicon layer, and an external of the first thin-film transistor is covered by a passivation layer so as to separate the first thin-film transistor from other portions of the array substrate.

11. A method of manufacturing a display panel, comprising:
forming a gate on a substrate;
forming a low-concentration doped P-type amorphous silicon layer on the gate;
sequentially forming a high-concentration doped N-type amorphous silicon layer, an amorphous silicon layer, and a source and a drain on the low-concentration doped P-type amorphous silicon layer to form a thin-film transistor, wherein the low-concentration doped P-type amorphous silicon layer comprises an extending portion, the extending portion comprises a first concave region and a second concave region both spaced apart from the gate;
forming a data line layer in the second concave region;
sequentially forming a light-sensitive high-concentration doped P-type amorphous silicon layer, a light-sensitive amorphous silicon layer and a light-sensitive high-concentration doped N-type amorphous silicon layer on the data line layer to form a photo-sensor, wherein the photo-sensor is positioned in the second concave region, and the first concave region is positioned between the thin-film transistor and the photo-sensor thereby isolating the photo-sensor from the thin-film transistor; and
forming a conductive glass layer on the photo-sensor, wherein the photo-sensor uses the data line layer as a lower electrode and uses the conductive glass layer as an upper electrode.

12. The method of manufacturing a display panel as claimed in claim 11, wherein the thin-film transistor and the photo-sensor are disposed below a color filter layer.

* * * * *